United States Patent [19]

Yoshizawa et al.

[11] 4,371,423

[45] Feb. 1, 1983

[54] METHOD OF MANUFACTURING SEMICONDUCTOR DEVICE UTILIZING A LIFT-OFF TECHNIQUE

[75] Inventors: Rokuro Yoshizawa, Neuss, Fed. Rep. of Germany; Satoshi Shinozaki, Yokohama, Japan

[73] Assignee: VLSI Technology Research Association, Japan

[21] Appl. No.: 183,813

[22] Filed: Sep. 3, 1980

[30] Foreign Application Priority Data

Sep. 4, 1979 [JP] Japan ................. 54-113231
Sep. 4, 1979 [JP] Japan ................. 54-113232

[51] Int. Cl.³ .................. H01L 21/283; H01L 21/308
[52] U.S. Cl. .................... 156/653; 156/656; 156/657; 156/659.1; 156/662; 430/314
[58] Field of Search ............. 156/628, 643, 653, 657, 156/659.1, 661.1, 662, 656; 430/314

[56] References Cited

U.S. PATENT DOCUMENTS

| | | | |
|---|---|---|---|
| 3,497,407 | 2/1970 | Esch et al. | 156/657 |
| 3,669,661 | 6/1972 | Page et al. | 430/314 |
| 3,971,684 | 7/1976 | Muto | 204/192 E |
| 4,060,427 | 11/1977 | Barice et al. | 156/653 |
| 4,076,575 | 2/1978 | Chang | 156/662 |
| 4,078,963 | 3/1978 | Symersky | 156/659.1 |
| 4,224,361 | 9/1980 | Romankiw | 430/314 |
| 4,256,816 | 3/1981 | Dunkelberger | 156/661.1 |
| 4,272,561 | 6/1981 | Rothman et al. | 430/314 |
| 4,309,812 | 1/1982 | Horng et al. | 156/653 |

OTHER PUBLICATIONS

Horng et al., "IBM Technical Disclosure Bulletin "Narrow Base . . . Structure", vol. 22, #9, (2/80), pp. 4054–4116.
Gegenworth et al., "Capped . . . Devices" IBM Technical Disclosure Bulletin, vol. 15, #11, (4/73), pp. 3538–3539.
Bergeron "Double Lift . . . Process" IBM Technical Disclosure Bulletin, vol. 21, #4, (9/78), pp. 1371–1372.
"Two Layered, Highly Packed Interconnection Metallization by a Lift-Off Process Utilizing PIO", Semiconductor Transistor Research Institute, SSD 78-65, pp. 33–40, Y. Homma et al.

Primary Examiner—Jerome W. Massie
Attorney, Agent, or Firm—Finnegan, Henderson, Farabow, Garrett & Dunner

[57] ABSTRACT

A method of manufacturing a semiconductor device comprising a step of covering a principal surface of a semiconductor substrate having semiconductor regions formed therein and at least partly provided with a silicon oxide film with a cover film having an etching characteristic different from that of the oxide film, a step of forming a first deposition layer having a higher etching speed than that of the cover layer on the cover layer, a step of forming a second deposition layer having a lower etching speed than that of the first deposition layer on the first deposition layer, a step of etching away portions of the second and first deposition layers and cover layer corresponding to a wiring pattern in succession, a step of etching the exposed portions of the silicon oxide film with the cover layer having the openings as a mask to thereby form contact holes with respect to the semiconductor substrate, and a step of forming wiring leads by depositing a wiring metal and etching away the first deposition layer and thus lifting off the second deposition layer and wiring metal portions thereon.

16 Claims, 12 Drawing Figures

METHOD OF MANUFACTURING SEMICONDUCTOR DEVICE UTILIZING A LIFT-OFF TECHNIQUE

BACKGROUND OF THE INVENTION

This invention relates to a method of manufacturing a semiconductor device, in which a wiring metal layer of a desired size and pattern is formed on the surfaces of semiconductor regions formed in a semiconductor substrate.

In the semiconductor device, in which a wiring metal layer of a desired size and pattern is formed on the surfaces of semiconductor regions formed in a semiconductor substrate, the wiring metal layer is usually formed by covering the semiconductor substrate with a silicon oxide film after forming, if necessary, a semiconductor region or semiconductor regions in the substrate, forming contact holes in predetermined portions of the silicon oxide film by using a mask, depositing a wiring metal on the entire silicon oxide film inclusive of the contact holes and selectively etching the wiring metal by using a mask to thereby form a desired wiring pattern.

This prior-art method, however, includes several mask alignment steps and also etching steps for obtaining the desired wiring metal pattern. Since the mask alignment step inevitably involves some deviation from the proper alignment between the mask and semiconductor substrate, the pattern formed on the semiconductor device formed on the semiconductor substrate must have extra dimensions to take up the possible deviation from the proper mask alignment. This means that the several mask alignment steps are not only tedious, but are also undesired from the standpoint of the improvement of the integration density of the device. In addition, at the time of the etching for the patterning of the wiring metal using a photoresist, the width of the wiring metal layer is made narrower than that of the photoresist due to what is called side etching, so that in order to obtain a wiring pattern having a desired width it is necessary to provide a photoresist pattern having an extra width corresponding to the amount of side etching, which is undesired from the standpoint of the improvement of the density of integration.

As an example of the prior-art method of manufacturing a semiconductor device, such as the one shown in FIG. 1, reference is made to a method in which the wiring is formed by a lift-off method. Such a method is disclosed in the "Semiconductor Transistor Research Institute", 1978, SSD78-65, page 33. In this method, a silicon oxide film 8 formed on a principal surface of a semiconductor substrate 7, which comprises a p-type silicon substrate 1, an $n^+$-type burried layer 2, an n-type epitaxial layer 3, isolation layers 4, a $p^+$-type base region 5 and an $n^+$-type collector region 6, is formed with base and collector contact holes 9 and 10 and an emitter diffusion hole 11, and an $n^+$-type emitter region 12 is formed by ion implanting arsenic with the base contact hole 9 covered with a photoresist. Subsequently, a polyimide resin film 13 and a metal film 14 of such metal as chromium are formed on the principal surface of the semiconductor substrate 7, and the metal film 14 is then subjected to dry etching using a photoresist mask to form openings corresponding to the contact holes 9 and 10 and diffusion hole 11. Thereafter, the polyimide film 13 is etched with a hydrazine hydrate solution and with the metal film 14 as a mask to form holes greater in diameter than the openings in the metal film 14, and then a wiring metal 15, for instance aluminum, is deposited on the entire surface (see FIG. 1). Afterwards, the polyimide resin film 13 is removed to lift off the aluminum portions 15 on the metal film 14.

In the above method, after the formation of the base and collector contact holes 9 and 10 and emitter diffusion hole 11, the polyimide resin film 13 and chromium or like metal film 14 are selectively etched in a separate step for the purpose of lifting off the wiring metal. This means that it is necessary to provide sufficient mask alignment redundancy for the etching of the polyimide resin film 13 and metal film 14. In addition, in the formation of the openings in the metal film 14 it is likely that they are not formed in self alignment to the base and collector contact holes 9 and 10 and emitter diffusion hole 11 as shown in FIG. 1. In such a case, it is likely that the contact between the emitter region 12 and associated wiring is adversely affected to reduce the yield.

SUMMARY OF THE INVENTION

An object of the invention is to provide a method of manufacturing semiconductor devices, which yields a high density of integration and a high yield and reduced cost.

According to the invention, openings are formed in a silicon nitride film on a silicon oxide film provided on a semiconductor substrate by making use of openings formed in a deposition layer to be lifted off, and contact holes are formed in the silicon oxide film, with the silicon nitride film formed with these openings serving as a mask. In this way, the contact holes can be formed in self alignment to the openings in the deposition layer by using only a single high precision alignment. Thus, it is possible to produce a semiconductor device, which has wiring layers in satisfactory contact with diffusion layers in the semiconductor substrate, and by which a high density of integration is achieved, by a very simple process and with a high yield.

The invention features a method of manufacturing a semiconductor device comprising a step of covering a principal surface of a semiconductor substrate having semiconductor regions formed therein and at least partly provided with a silicon oxide film with a cover film thereon having an etching characteristic different from that of the oxide film, a step of forming a first deposition layer having a higher etching speed than that of the cover film on the cover film, a step of forming a second deposition layer having a lower etching speed than that of the first deposition layer on the first deposition layer, a step of selectively etching away in succession portions of the second and first deposition layers and cover film corresponding to a wiring pattern thereby forming openings in the cover film and exposing the portions of the silicon oxide film beneath such openings, a step of etching the exposed portions of the silicon oxide film with the cover film with openings serving as a mask to thereby form contact holes with respect to the semiconductor substrate, and a step of forming wiring leads by depositing a wiring metal over the contact holes and the second deposition layer and etching away the first deposition layer, thus lifting off the second deposition layer and wiring the metal portions thereon.

According to the invention, the cover film may comprise, for instance, a silicon nitride film. This cover film serves as a mask at the time of the formation of the contact holes in the silicon oxide film and permits the formation of the contact holes substantially in self alignment to the openings in the second deposition layer. Also, at the time of the deposition of the wiring metal it is partly overlapped by part of the deposited metal to ensure reliable contact between the deposited wiring metal and diffusion layers in the semiconductor substrate and also aid to provide a thickness reduction profile of the edges of the wiring layer.

Since the first deposition layer according to the invention is the essential portion for making the lifting-off and is also side etched to form a depressed portion with respect to the second deposition layer at the time when forming the contact holes by etching the silicon oxide film through the cover film which serves as a mask, it must be made of a material of a very high etching speed compared to the silicon nitride film. Examples of materials suitable for use as the first deposition layer are an impurity-containing glass such as phorphorus-containing glass (PSG) or arsenic-containing glass (AsSG) and polycrystalline silicon.

Since, at the time of depositing the wiring metal layer, portions thereof the which are deposited at the bottom of the contact holes and the portions thereby which are lifted off together with the second deposition layer are separately deposited, it is desirable that the width of the openings of this second deposition layer be smaller than that of the openings in the first deposition layer, that is, the second deposition layer projects laterally with respect to the first deposition layer at the openings. Accordingly, the material of the second deposition layer suitably has an etching speed lower than that of the first deposition layer and an excellent etching-resisting property. Examples of suitable materials for the second deposition layer are silicon nitride, silicon oxide and metals such as, for example chromium.

For etching the silicon oxide film through the cover film (e.g., silicon nitride) film as a mask in accordance with the invention, it is effective to adopt a liquid etching method using a blend liquid consisting of ammonium fluoride and acetic acid because of the fact that with this method side etching of the first deposition layer can be effectively obtained.

Examples of the wiring metal used according to the invention are Al, Al alloys such as Al-Si and Al-Cu, Mo, Pt and other refractory metals.

DETAILED DESCRIPTION OF THE PREFERRED EMBODIMENT

An embodiment of the invention applied to the manufacture of a bipolar transistor will now be described with reference to FIGS. 2A to 2K.

Figure 1:
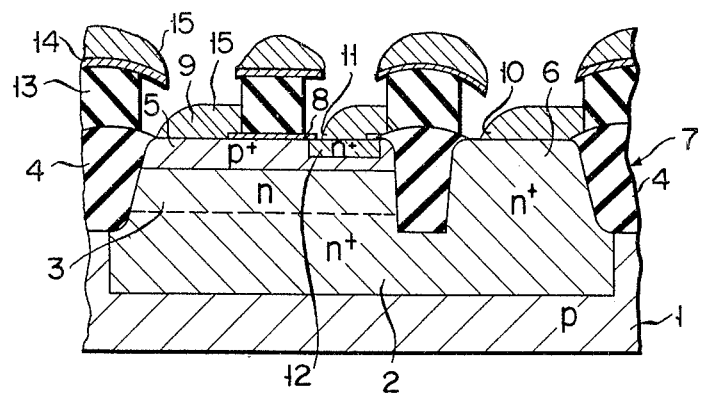
FIG. 1 is a sectional view showing a semiconductor wafer immediately before a lift-off step in the manufacture of a bipolar transistor by a prior-art method.
Figure 2A:
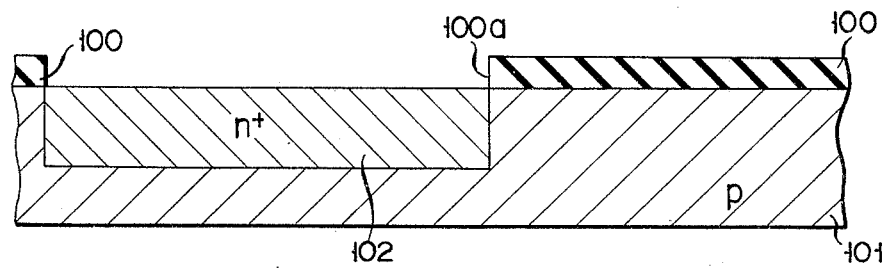
FIGS. 2A to 2K are views showing respective steps of the method according to the invention applied to the manufacture of a bipolar transistor.

A p-type silicon substrate 101, as shown in FIG. 2A, with a resistivity of 20 Ω·cm was prepared, and a silicon oxide mask 100 was formed on one principal surface of the substrate 101. An opening 100a was formed in silicon oxide mask 100, and arsenic was diffused by the ordinary thermal diffusion method through this opening 100a into the substrate 101 to form an n+-type high impurity concentration buried layer 102.

Figure 2B:
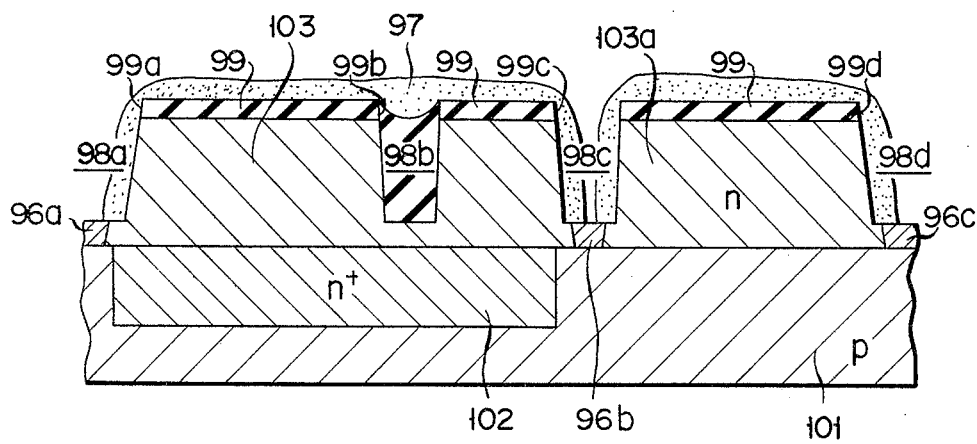
Figure 2C:
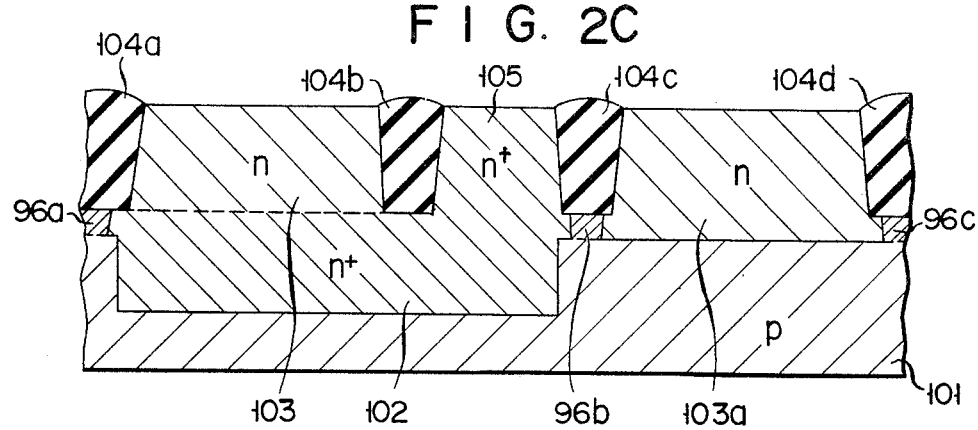

Then, the silicon oxide mask 100 was removed from the principal surface of the substrate 101, and an n-type epitaxial layer 103 with a specific resistivity of $\rho_{VG}=0.3\Omega\cdot cm$ and a thickness of 1.7μ was formed over the entire exposed principal surface of the substrate 101 (see FIG. 2B). A silicon nitride film 99 with a thickness of 3,000 Å was then formed over the entire surface of the epitaxial layer 103. Then, it was selectively etched off to form openings 99a, 99b, 99c and 99d and expose corresponding portions of the epitaxial layer 103. The exposed portions of the epitaxial layer 103 were then etched in a solution consisting of potassium hydroxide, with the silicon nitride film 99 used as etching mask, to a depth of about 0.6μ, thus forming etched holes 98a, 98b, 98c and 98d. Then, the parts of the etched holes 98a, 98c and 98d which were not placed on the buried region 102 were partially filled with a photoresist 97, while the etched hole 98b was entirely filled with photoresist 97. In this state boron was ion implanted into portions of the substrate constituting the bottom of the etched holes 98a, 98c and 98d to form p+-type regions 96a, 96b and 96c which have such a depth that they were contiguous to the p-type silicon substrate 101.

Subsequently, the photoresist 97 was removed, and the whole wafer shown in FIG. 2B was subjected to a thermal treatment. After the thermal treatment, the whole wafer was subjected to a thermal oxidizing treatment, whereby silicon oxide films 104a to 104d for element separation with a thickness of 1.2μ were formed in the respective etched holes 98a to 98d (see FIG. 2C). Then, a portion of the silicon nitride film 99 adjacent to hole 99c, in which the collector of a bipolar transistor (see FIG. 2B) was formed, was selectively removed, and phosphorus was diffused into the epitaxial layer 103 from the exposed surface thereof to form an n+-type collector region 105 with a sheet resistivity of about $\rho_s = 6\Omega/\square$ and reaching the n+-type buried layer 102 (see FIG. 2C). During the thermal oxidizing treatment and the phosphorus diffusion, the impurities in the n+-type buried layer 102 were diffused into the n-type epitaxial layer 103, so that the n+-type buried layer 102 became contiguous to the bottom of the isolation film 104b.

Figure 2D:
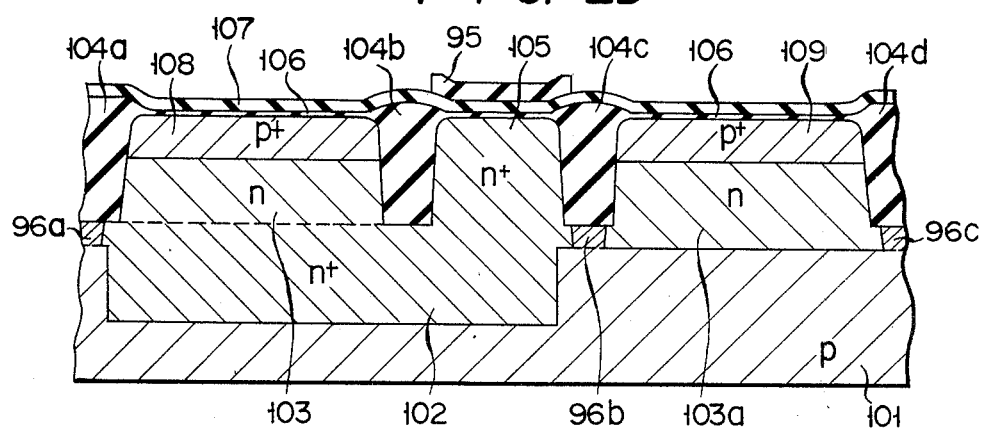

Thereafter, the silicon nitride film 99 was all removed to expose the epitaxial layer 103 and 103a. In this state, a silicon oxide film 106 with a thickness of 500 Å was grown over the entire surface of the wafer, as shown in FIG. 2D, and then a silicon nitride film 107 with a thickness of 1,500 Å was formed on the silicon oxide film 106. Further, a photoresist film 95 was formed on a portion of the silicon nitride film 107 corresponding to the collector region 105.

Afterwards, boron was ion implanted from above the silicon nitride film 107 with an accelerating voltage of 90 keV and a dose of $3 \times 10^{14}$ cm$^{-2}$, followed by a thermal treatment in a nitrogen atmosphere at 1,000° C., whereby a p+-type base region 108 and a resistive layer 109 were formed in upper portions of the epitaxial layers 103, and 103a, respectively.

Figure 2E:
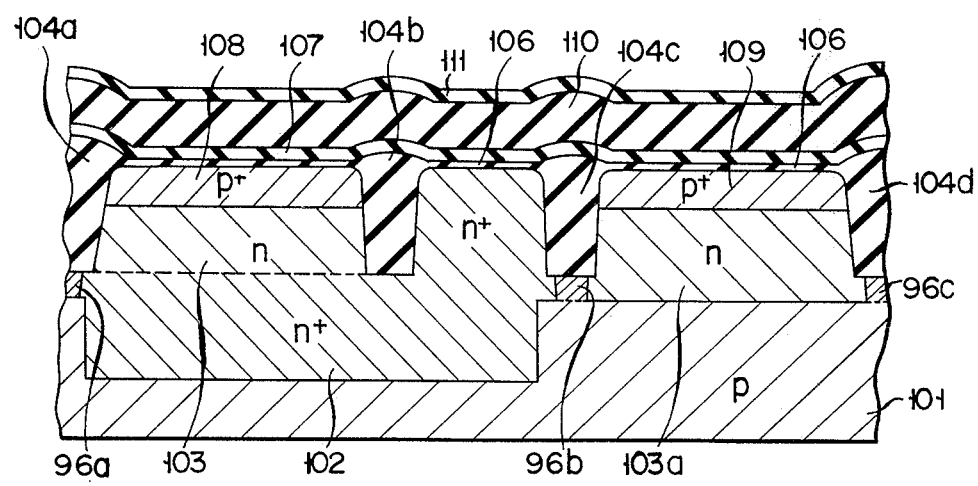
Figure 2F:
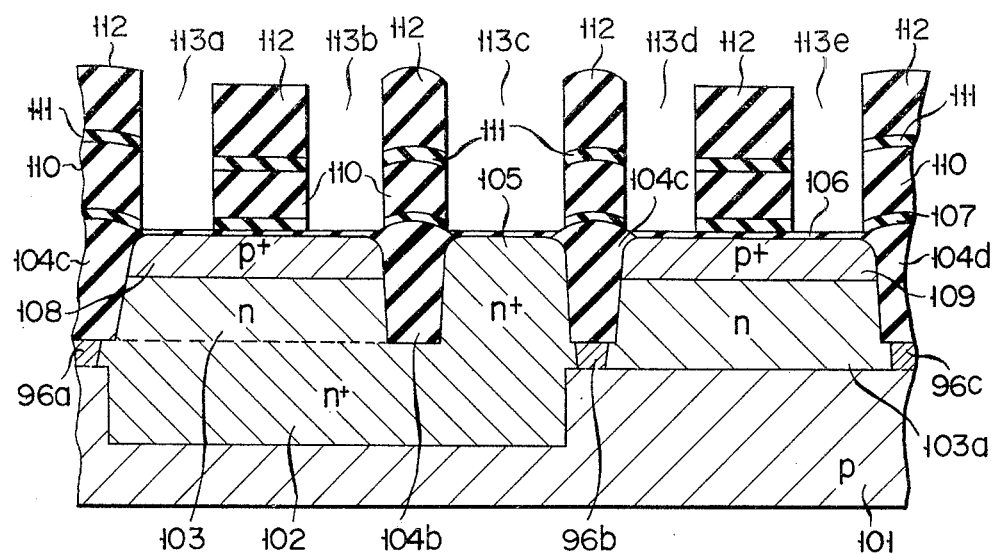
Figure 2G:
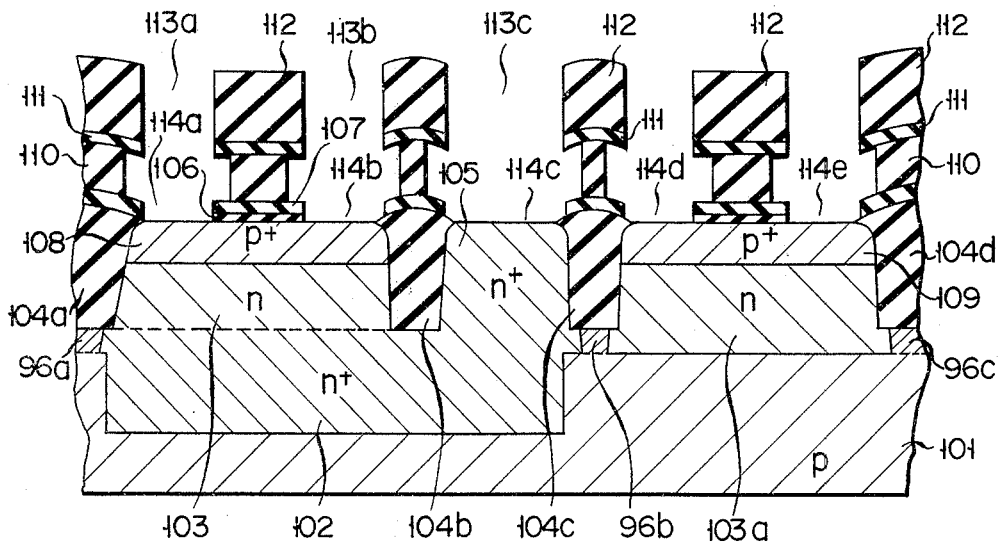

Then, the photoresist film 95 having been used as a mask at the time of the ion implantation was removed, and a phorphorus-containing glass layer (PSG layer) 110 as a first deposition layer with a phosphorus concentration of about $1 \times 10^{21}$ cm$^{-3}$ and a thickness of 7,000 Å and a silicon nitride layer 111 as a second deposition layer with a thickness of 2,000 Å were formed in the mentioned order on the exposed silicon nitride film 107 (see FIG. 2E). Subsequently, a photoresist film was formed on the silicon nitride film 111 and selectively photoetched to form a photoresist pattern 112 for forming contact holes and wiring patterns at the same time. Then, with the photoresist pattern 112 used as etching mask, the silicon nitride layer 111, PSG layer 110 and silicon nitride film 107 are selectively etched in succession by a reactive sputter etching method with an output of 180 W and a $CF_4$ flow rate of 21 cc/min. At this time, openings 113a to 113e were formed as shown in FIG. 2F, but no side etching of the opening patterns of PSG layer 110 with respect to those of the silicon nitride layer 111 was observed. Also, the silicon oxide film 106 remained at the bottom of the openings 113a to 113e, and no damage was caused (by dry etching) in the base region 108, collector region 105, or resistive region 109.

Figure 2H:
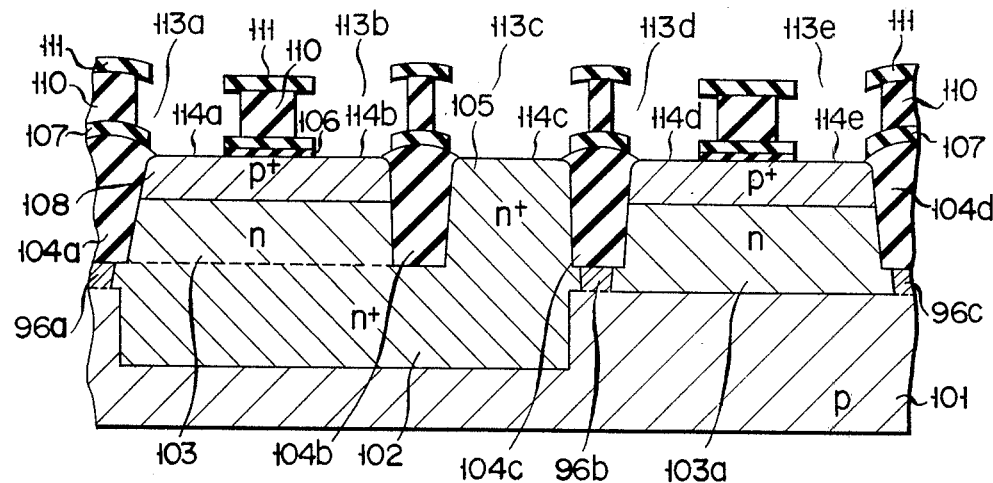
Figure 2I:
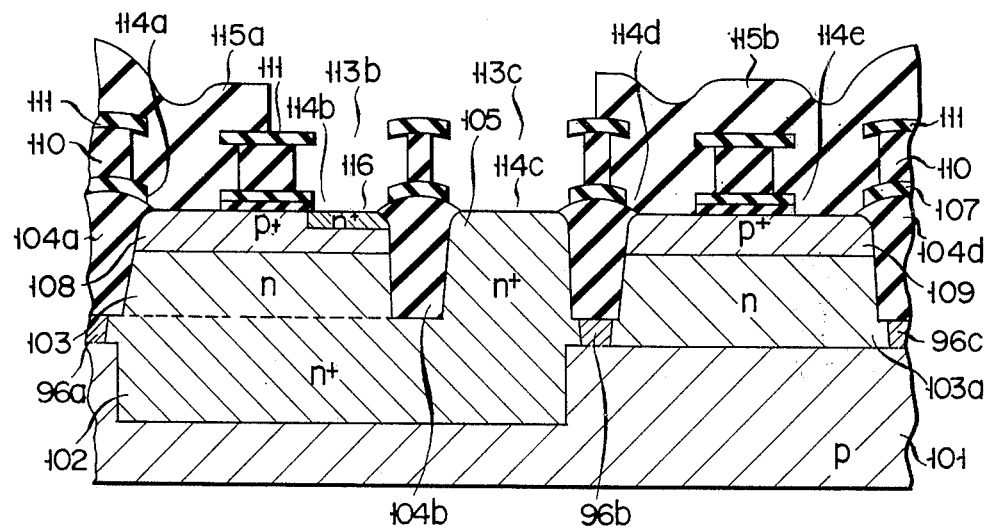

The resistive wafer of FIG. 2F was then immersed in an etching liquid of ammonium fluoride for 40 seconds. As a result, portions of the silicon oxide film 106 exposed to the openings 113a to 113e in the silicon nitride film 107 are etched away, and the remaining portions of the PSG layer 110 are etched laterally by $0.7\mu$. Thus, in this embodiment, two etching steps, i.e. etching of the exposed portions of the silicon oxide film 106 and side etching of PSG layer 110, are achieved at the same time with the ammonium fluoride etching liquid. Subsequently, the photoresist pattern 112 was etched away, whereby contact holes 114a to 114e which are aligned by self alignment to the respective openings 113a to 113e in the silicon nitride layer 111 as the uppermost layer at this time were obtained, with the remaining portions of the silicon nitride film 107 and silicon nitride film 111 projecting by $0.7\mu$ from the corresponding portions of the PSG layer 110 as shown in FIG. 2H. Thereafter, the base contact hole 114a and contact holes 114d and 114e for the p+-type resistive layer 109 were selectively filled with photoresist layers 115a and 115b. Since the photoresist layers 115a and 115b are formed only for the purpose of covering the contact holes for the p+-type regions 108 and 109, the masking precision for the pattern formation at this time may be very low. Afterwards, arsenic was ion implanted through the openings 113b and 113c with an accelerating voltage of 50 keV and a dose of $1 \times 10^{16}$ cm$^{-2}$ (see FIG. 2I.) Then, the photoresist layers 115a and 115b were pealed off, and the resultant wafer was subjected to a thermal treatment at 1,000° C. for 60 minutes to form an n+-type emitter region 116 with a sheet resistivity of $\rho_s = 20 \, \Omega/\square$ and a depth of $0.4\mu$ as n+-type diffusion layer.

Figure 2J:
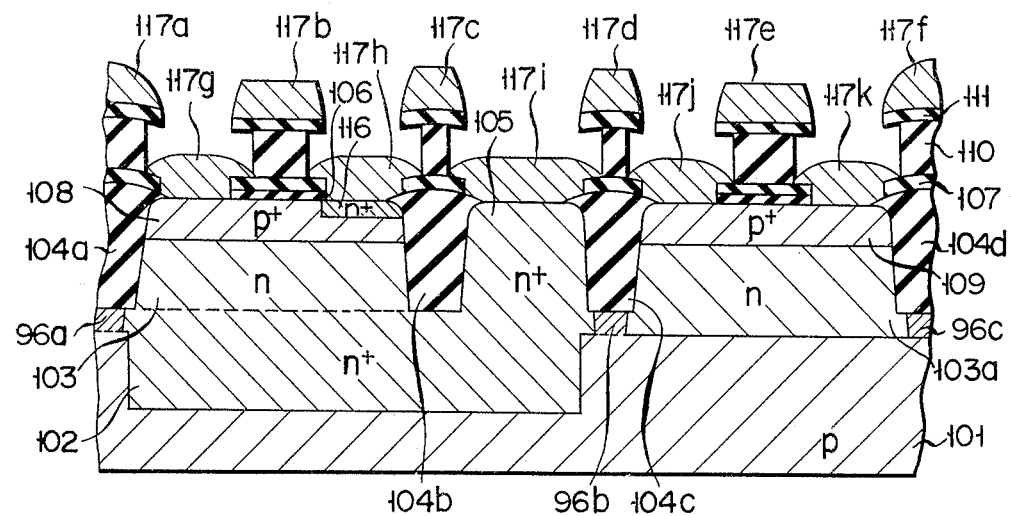
Figure 2K:
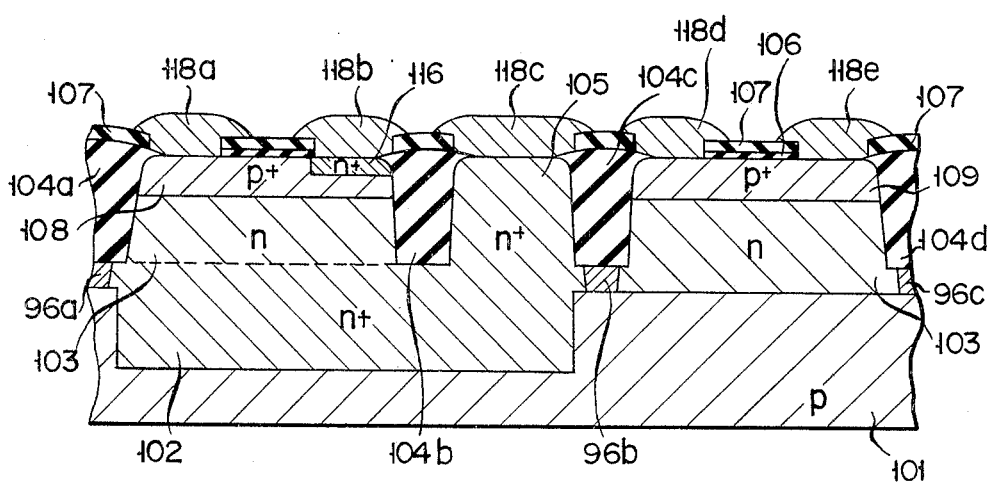

Then, an aluminum film 117 with a thickness of $0.5\mu$ was deposition formed was wiring metal over the entire surface as shown in FIG. 2J. At this time, aluminum film portions 117g to 117k on the bottom of the contact holes 114a to 114e and aluminum film portions 117a to 117f on the silicon nitride layer 111 are deposited separately from one another, and portions of the silicon nitride film 107 in edge portions of the contact holes 114a to 114e were covered by the aluminum film portions 117g to 117k. Subsequently, the wafer was immersed in a blend liquid consisting of ammonium fluoride and acetic acid to etch away the PSG layer 110, thus lifting off the remaining portions of the silicon nitride film 111 and aluminum film portions 117a to 117f deposited thereon. In this way, aluminum wiring layers 118a to 118e in contact with the respective diffusion layers 108, 116, 105 and 109 were formed through the respective contact holes 114a to 114e to obtain a bipolar transistor (see FIG. 2K). Since the etching speed of aluminum in the aforementioned blend liquid consisting of ammonium fluoride and acetic acid is 50 Å/min, there was practically no problem about the thickness reduction of the aluminum film at the time of removal of the PSG layer by etching.

In the bipolar transistor obtained in the above way, the aluminum wiring 118a to 118e, which was formed in self alignment to the contact holes 114a to 114e and partly overlaps the silicon nitride film 107, was satisfactorily connected to the collector region 105, base region 108, emitter region 116 and resistive layer 109 without any portion getting out of the contact holes. Also, since the opposite edge portions of the wiring layers 118a to 118e overlapping the silicon nitride film 107 decrease in thickness toward the edge, there is no possibility of a burn-out in a second wiring layer in cases where a multi-layer wiring process is adopted. Further, in the instant embodiment, only a single mask alignment, which determines the basic dimensions for the process from the formation of the contact holes 114a to 114e until the formation of the first wiring layer, is required for forming the contact holes and wiring. For this reason, it is possible to expect considerable improvement of the yield. Secondly, the process can be simplified with the reduction of the time required for the mask alignment. Thirdly, there is no need for providing redundancy for the mask alignment between the contact holes and wiring metal. Still further, some of the contact holes 114a to 114e such as the hole 114e may be utilized as the diffusion hole for forming the emitter region 116 in self alignment to the contact hole 114b. Thus, it is possible to reliably prevent the non-alignment of the wiring 118b to the emitter region 116 and ensure satisfactory contact.

The above embodiment of the invention applied to the manufacture of a bipolar transistor is by no means limitative, and the invention may also be applied to the manufacture of a MOS FET transistor.

As has been described in the foregoing, according to the invention it is possible to provide a method, with which only a single mask alignment determining the basic dimensions for the process from the formation of the contact holes to the formation of the first wiring layer is required for forming the contact holes and wiring, and which permits the formation of the diffusion layers, contact holes and wiring layers in self alignment to one another, with the wiring in proper alignment and satisfactory contact with the diffusion layers in the semiconductor substrate, thus permitting the manufacture of semiconductor devices of a high density of integration with a high yield and a simple process.

What we claim is:

1. A method of manufacturing a semiconductor device, comprising:
    forming a first film on one principal surface of a semiconductor substrate having a plurality of semiconductor regions formed therein, said regions being isolated by separation walls;
    forming a second film covering said first film, said second film having an etching characteristic different from that of said first film;
    forming a first deposition layer on said second film, said first deposition layer having a higher etching speed than that of said second film when etched with a selected etchant;

forming a second deposition layer on said first deposition layer, said second deposition layer having a lower etching speed than that of said first deposition layer when etched with said selected etchant;

selectively etching preselected portions of said second and first deposition layers and said second film in succession, thereby exposing segments of said first film, said preselected portions corresponding to desired wiring patterns for said plurality of semiconductor regions of the device;

selectively side etching additional portions of said first deposition layer by etching said additional portions with said selected etchant at a higher etching speed than that of said second film and said second deposition layer;

etching the exposed segments of said first film with said selected etchant to form contact holes corresponding to said plurality of semiconductor regions, the etching of said exposed segments being performed simultaneously with said side etching of said first deposition layer;

then depositing a wiring metal on said contact holes from above said second deposition layer, the unetched portions of said second deposition layer comprising a deposition mask upon which portions of the wiring metal are deposited; and then removing the remaining portions of said first deposition layer by etching, thereby lifting off the remaining portions of said second deposition layer and the portions of the wiring metal deposited thereon.

2. A method of manufacturing a semiconductor device according to claim 1, which further comprises a step of forming a predetermined semiconductor region in said aforementioned semiconductor regions in self alignment to at least one of said contact holes by using said at least one contact hole.

3. A method of manufacturing a semiconductor device according to claim 1 or 2, wherein said first film is a silicon oxide film, and said second film is a silicon nitride film.

4. A method of manufacturing a semiconductor device according to claim 3, wherein said first deposition layer is an impurity-containing glass layer.

5. A method of manufacturing a semiconductor device according to claim 3, wherein said first deposition layer is a polycrystalline silicon layer.

6. A method of manufacturing a semiconductor device according to claim 1, wherein said second deposition layer is a silicon nitride film.

7. A method of manufacturing a semiconductor device according to any one of claims 1, 4 or 5, wherein said second deposition layer is a silicon oxide film.

8. A method of manufacturing a semiconductor device according to claim 1, wherein said second deposition layer is comprised of chromium.

9. A method of manufacturing a semiconductor device according to claim 3, wherein said second deposition layer is a silicon nitride film.

10. A method of manufacturing a semiconductor device according to claim 3, wherein said second deposition layer is a silicon oxide film.

11. A method of manufacturing a semiconductor device according to claim 3, wherein said second deposition layer is comprised of chromium.

12. A method of manufacturing a semiconductor device as claimed in claim 4, wherein the step of selectively side etching additional portions of said first deposition layer and the step of etching the exposed segments of said first film to form contact holes are carried out simultaneously with a single etchant.

13. A method as claimed in claim 3, wherein the portions of said second and first deposition layers and said second film are selectively etched in succession by reactive sputter etching.

14. A method as claimed in claim 1, wherein said separation walls are comprised of silicon oxide.

15. A method of manufacturing a semiconductor device, comprising:

forming a first film on one principal surface of a semiconductor substrate having a plurality of semiconductor regions formed therein, said regions being isolated by separation walls;

forming a second film covering said first film, said second film having an etching characteristic different from that of said first film;

forming a first deposition layer on said second film, said first deposition layer having a higher etching speed than that of said second film when etched with a selected etchant;

forming a second deposition layer on said first deposition layer, said second deposition layer having a lower etching speed than that of said first deposition layer when etched with said selected etchant;

selectively etching preselected portions of said second and first deposition layers and said second film in succession, thereby exposing segments of said first film, said preselected portions corresponding to desired wiring patterns for said plurality of semiconductor regions of the device;

selectively side etching additional portions of said first deposition layer by etching said additional portions with said selected etchant at a higher etching speed than that of said second film and said second deposition layer;

etching the exposed segments of said first film to form contact holes corresponding to said plurality of semiconductor regions; then depositing a wiring metal on said contact holes from above said second deposition layer, the unetched portions of said second deposition layer comprising a deposition mask upon which portions of the wiring metal are deposited; and then removing the remaining portions of said first deposition layer by etching, thereby lifting off the remaining portions of said second deposition layer and the portions of the wiring metal deposited thereon.

16. A method as claimed in claim 1, 2, or 15, wherein the portions of said second and first deposition layers are selectively etched in succession by reactive sputter etching.

* * * * *